United States Patent [19]

[11] 3,899,747

Giles et al.

[45] Aug. 12, 1975

[54] ARRANGEMENT FOR PROVIDING RADIO EQUIPMENT WITH A PLURALITY OF OSCILLATORS

[75] Inventors: Olin S. Giles; Edwin C. Lafferty, both of Lynchburg, Va.

[73] Assignee: General Electric Company, N.Y.

[22] Filed: Sept. 26, 1973

[21] Appl. No.: 400,842

[52] U.S. Cl. ........................ 331/2; 325/17; 325/18; 325/458; 331/49; 331/116 R; 331/176

[51] Int. Cl. ........................ H03b 3/04

[58] Field of Search ......... 331/49, 2, 68, 69, 116 R, 331/161, 176; 325/15-25, 452, 458

[56] References Cited

UNITED STATES PATENTS

| | | | |
|---|---|---|---|
| 3,158,821 | 11/1964 | Sulzer | 331/69 |
| 3,176,244 | 3/1964 | Newell et al. | 331/176 |
| 3,581,239 | 5/1971 | Knutson | 331/161 |
| 3,626,330 | 12/1971 | Zalonis | 331/161 |
| 3,763,440 | 10/1973 | Garcia | 331/176 |

*Primary Examiner*—John Kominski

[57] ABSTRACT

Radio equipment, such as a mobile transmitter and receiver, may require or use a fairly large number of frequencies, some of which may have a relatively low frequency stability and some of which must have a relatively high frequency stability. An oscillator module is provided for each frequency needed by the equipment. Each oscillator module has an oscillator that is substantially similar to the other oscillators and that has a temperature compensator input. And each oscillator module has a temperature compensator receptacle. Each of the high stability oscillator modules which must provide the high frequency stability is provided with a temperature compensator in its receptacle. The compensator output is connected to its respective oscillator compensator input, and the compensator is adjusted so that its oscillator has the relatively high frequency stability. One of the other oscillator modules which may provide a relatively low frequency stability is provided with a compensator in its receptacle, and this module is designated the master oscillator module. The compensator output of the master oscillator module is connected to its own oscillator compensator input and to all oscillator compensator inputs in the other modules which may provide the low frequency stability. These other modules are designated slave oscillator modules. Thus, a single oscillator module can be provided, an individual compensator provided in each high stability module, and one compensator provided in a master oscillator module for all of the low frequency stability modules.

5 Claims, 2 Drawing Figures

ARRANGEMENT FOR PROVIDING RADIO EQUIPMENT WITH A PLURALITY OF OSCILLATORS

BACKGROUND OF THE INVENTION

Our invention relates to an arrangement for providing oscillators for radio equipment, and particularly to an arrangement that permits a single type oscillator to be used to provide two different frequency stabilities in an efficient and easily reproducible manner.

Crystal controlled oscillators are used extensively in radio equipment. The frequency stability with respect to temperature of such oscillators has been increased by the use of a voltage sensitive, frequency determining capacitor. This capacitor is supplied with a voltage from a temperature sensitive compensator to cause the oscillator to have a more stable frequency despite variations in temperature. Previous arrangements have used a single temperature compensator to provide a direct current voltage for all of the voltage sensitive capacitors in a plurality of oscillators so as to provide the oscillators with a relatively low frequency stability, for example plus or minus five parts per million (±5 ppm). If as frequently happens, the radio equipment requires one or more oscillators having a relatively high frequency stability, for example ±2 ppm, the arrangement of one temperature compensator for several oscillators does not provide the desired or needed high frequency stability. If, as also frequently happens, the radio equipment required both high and low stability for a number of frequencies, such a requirement either has not been met or has been met only by a specific and relatively expensive design.

Accordingly, a primary object of our invention is to provide an improved arrangement of oscillators, selected ones of which may have a relatively low frequency stability and selected ones of which may have a relatively high frequency stability.

Another object of our invention is to provide a new and improved arrangement having an oscillator module that permits individual compensation stability to be provided or multiple compensation stability to be provided.

Another object of our invention is to provide a new and improved oscillator module that can be used to provide almost any desired oscillator frequency having either a high or low frequency stability.

Another object of our invention is to provide a new and improved arrangement of oscillator modules which permit a radio circuit to be easily designed and produced.

Another object of our invention is to provide a new and improved arrangement of oscillator modules, any one of which can be replaced by an oscillator module of different frequency or stability.

SUMMARY OF THE INVENTION

Briefly, these and other objects are achieved in accordance with our invention by an oscillator module that has a crystal oscillator and a receptacle or space for a temperature compensator. If the oscillator module is to provide high frequency stability, a compensator is placed in the receptacle and connected to that oscillator only and adjusted for that oscillator. If the oscillator module is to provide only low frequency stability, a compensator is placed in the receptacle and connected internally to the oscillator of that module and connected externally to oscillators of other modules which must provide only low frequency stability. The oscillator module can be built in reproducible quantities, and permits radio equipment to be easily designed to operate with a number of frequencies, each of which may have a high or low stability.

BRIEF DESCRIPTION OF THE DRAWING

The subject matter which we regard as our invention is particularly pointed out and distinctly claimed in the claims. The structure and operation of our invention, together with further objects and advantages, may be better understood from the following description given in connection with the accompanying drawing, in which:

DESCRIPTION OF THE PREFERRED EMBODIMENT

Figure 1:
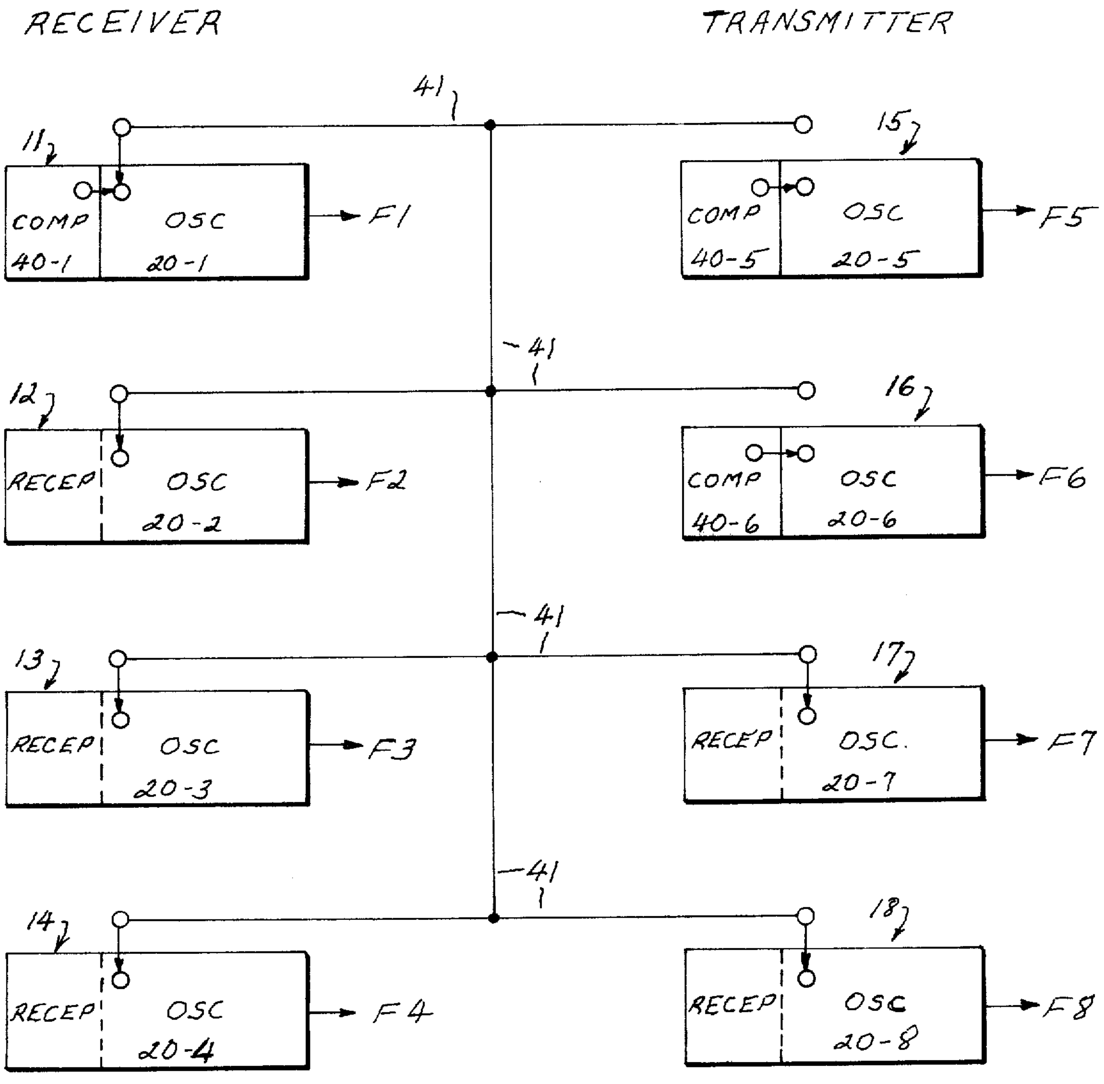
FIG. 1 shows a block diagram of a plurality of oscillator modules constructed and connected in accordance with our invention to provide a plurality of frequencies, some of which have a high stability and some of which have a low stability.

For illustrative purposes only, we have assumed that our improved arrangement is to be used in radio equipment comprising a mobile radio receiver that requires the generation of four frequencies F1, F2, F3, F4, and comprising a mobile radio transmitter that requires generation of four frequencies F5, F6, F7, F8. We have further assumed that the transmitter frequencies F5, F6 must have a high stability, and that the other transmitter frequencies F7, F8 and all of the receiver frequencies F1, F2, F3, F4 need have only a low stability. In a practical application, the high frequency stability would be within plus or minus two parts per million (±2 ppm), and the low frequency stability would be within plus or minus five parts per million (±5 ppm). In accordance with our invention, we provide eight oscillator modules 11 through 18, each of which is substantially identical or similar to the others. Each of the modules 11 through 18 is provided with a respective crystal oscillator, the oscillators being designated 20-1 through 20-8 respectively. Each of the modules 11 through 18 also comprises a receptacle (RECEP) or space in which a compensator (COMP) may be placed. In accordance with our invention, each module which must have the high frequency stability is provided with a temperature compensator in its receptacle. One of the modules, which is to have only the low frequency stability, is provided with a temperature compensator, and this compensator serves all of the modules having the low stability. In accordance with the assumed example, each of the modules 15, 16 has a compensator 40-5, 40-6, the output of which is connected to the oscillators 20-5, 20-6 as indicated by the arrow in the modules 15, 16 so as to provide the transmitter with the high stability frequencies F5, F6. Also in accordance with the example, all of the other modules 11, 12, 13, 14, 17, 18 need have only a low stability, so that only one module 11 (designated a master oscillator module) is provided with a temperature compensator 40-1. At least one master oscillator module must be present with any low stability oscillator modules. The output of this compensator 40-1 is connected to the oscillator 20-1 in its module 11 and is also connected by a compensation line 41 to all of the other oscillators 20-2, 20-3, 20-4, 20-7, 20-8 to provide compensation for these other modules (designated slave oscillator modules). When radio equipment in accordance with our invention is designed, the compensation line 41 (which may be a wire connection or a printed run) can be placed in the equipment so that any slave oscillator module is externally provided with the compensation voltage from the master oscillator module. For example, the compensation line 41 can be placed on the mother board on which the modules are placed and connected. Of course, no connection from the compensation line 41 is made to an oscillator in a high stability oscillator module. Thus, our module arrangement permits a versatility of design and an ease of construction, in that only one type of oscillator is needed, only one type of compensator is needed, and compensators individually provided for those oscillators which must have a high stability, and only one compensator provided for all other oscillators which need have only low stability. Persons skilled in the art, particularly designers and manufacturers, will appreciate the advantages of this simplicity and versatility.

Figure 2:
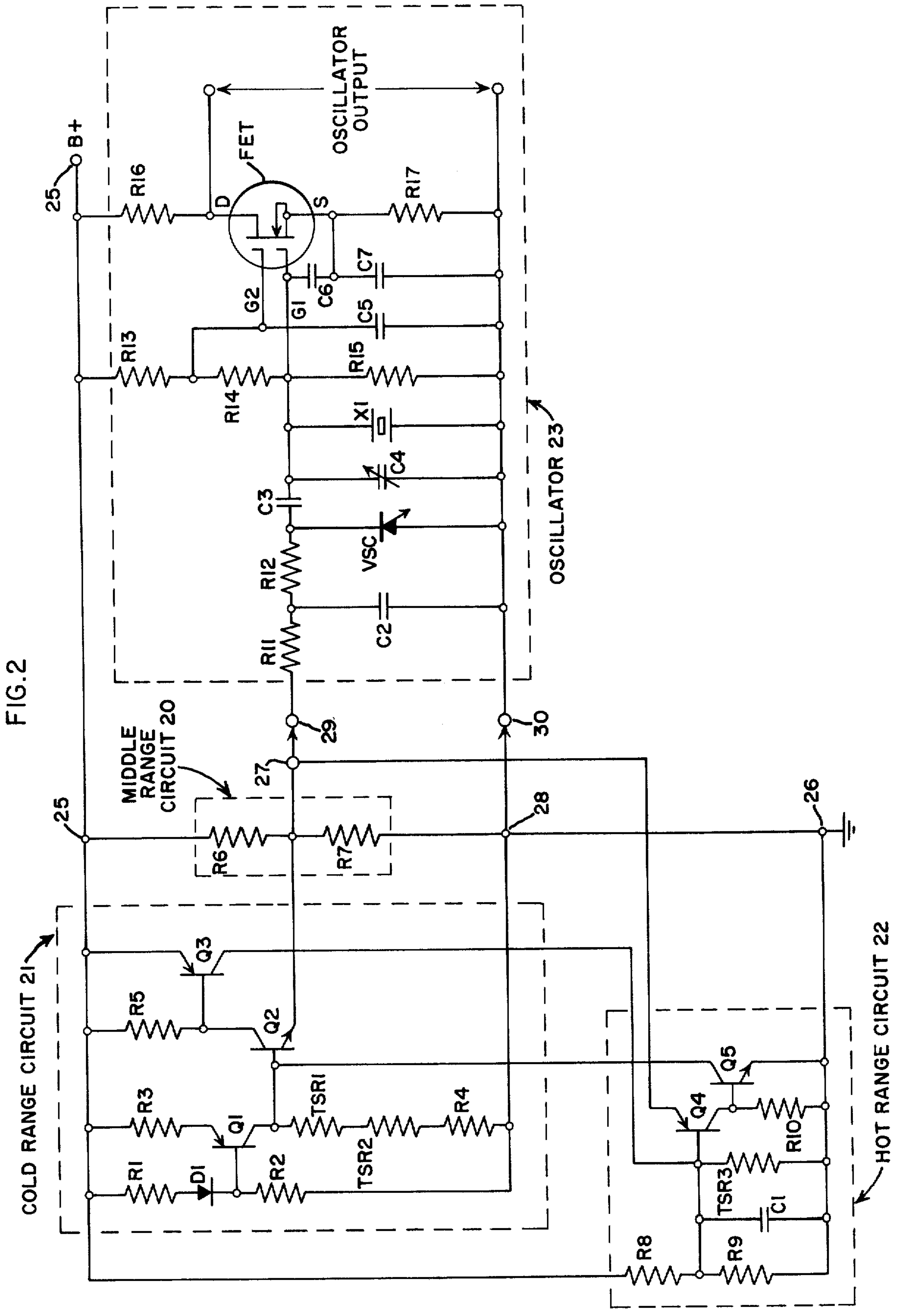
FIG. 2 shows a schematic diagram of an oscillator and compensator which may be used in the oscillator modules of FIG. 1.

FIG. 2 shows, by way of example only, a schematic diagram of an oscillator 23 and a temperature compensator which can be used in the modules of FIG. 1. The oscillator 23 uses a Colpitts circuit which has a dual gate field effect transistor FET connected as shown. A piezoelectric crystal X1 is connected between the gate G1 and a common terminal 30. A trimmer capacitor C4 may be connected in parallel with the crystal X1. The gate G1 is connected to an ordinary capacitor C6 and an inverse temperature capacitor C7. This capacitor C7 provides the stability rotation which, if needed, can change the oscillator stability characteristic. The oscillator output is derived between the drain electrode D and the terminal 30. A voltage sensitive capacitor VSC is also connected in the oscillator circuit, and the actual capacitance presented by this capacitor, and hence the output frequency of the oscillator 23, is determined by the direct current voltage supplied to the oscillator 23 at its compensator input terminal 29.

The direct current voltage for the terminal 29 can be supplied by the compensator circuit shown generally in the left hand portion of FIG. 2. This compensator includes a middle temperature range circuit 20, a cold temperature range circuit 21, and a hot temperature range circuit 22, each of which provides its compensating voltage at an output terminal 27. The middle range circuit 20 provides a fixed reference or middle range voltage for the oscillator 23 when the cold range circuit 21 and the hot range circuit 22 are not functioning. The cold range circuit 22 functions at the cold temperatures and supplies a direct current voltage at the emitter of a transistor Q2 to control the capacity of the capacitor VSC. When the cold range circuit 21 produces this direct current voltage, a transistor Q3 turns the hot range circuit 22 off. In a similar fashion, the hot range circuit 22 provides a direct current at the emitter of a transistor Q4 to vary the voltage on the capacitor VSC in the hot temperature ranges. When the hot range circuit 22 functions, a transistor Q5 turns the cold range circuit 21 off. More details of the compensator and the oscillator shown in FIG. 2 are presented in a patent application entitled "Improved Temperature Compensator For a Crystal Oscillator," filed Aug. 6, 1973, Ser. No. 386,060. However, it is to be emphasized that our invention of FIG. 1 may utilize almost any type of oscillator and any type of temperature compensator. We have shown the oscillator and compensator of FIG. 2 as a convenient sample.

With respect to FIG. 1, each of the modules would be provided with an oscillator such as the oscillator 23. The high stability modules 15, 16 would each be provided with a compensator 40-5, 40-6, and each of these compensator outputs would be connected to its respective oscillator 20-5, 20-6 as shown in FIG. 1. (With respect to FIG. 2, these connections would be made from the compensator output terminals 27, 28 to the oscillator input terminals 29, 30.) Each of the compensators 40-5, 40-6 would be matched or adjusted to provide the high frequency stability for their respective oscillators 20-5, 20-6. The master oscillator module 11 of FIG. 1 would also include a compensator 40-1. This compensator 40-1 would be connected to the oscillator 20-1 in its own master oscillator module 11 and would be connected by a connection 41 to each of the other oscillators 20-2, 20-3, 20-4, 20-7, 20-8 in the slave modules 12, 13, 14, 17, 18 so as to provide these oscillators with the low stability. (With respect to FIG. 2, these connections 41 would also be from the compensator output terminals 27, 28 to the input terminals 29, 30 of each of the oscillators). We have found that present production techniques and tolerances permit the one master compensator 40-1 to control its oscillator 20-1 and the slave oscillators to within the low stability range. Persons skilled in the art will appreciate that if the compensators and oscillators are all substantially identical, the stability provided to the slave oscillators could be as good as the stability provided to the high stability oscillators 20-5, 20-6 by their individual matched compensators. However, we have found that production techniques favor the use of oscillators having greater tolerances, as long as the stability requirements are met.

It will thus be seen that we have provided an improved arrangement for providing radio equipment with a plurality of oscillators. While we have shown only one embodiment in FIG. 1, persons skilled in the art will appreciate that almost any configuration of individual high stability oscillator modules and master-slave oscillator modules can be used. The number of oscillators which a compensator can control is limited only by the total amount of leakage current through the voltage sensitive capacitors in the individual oscillators. We have found that generally one compensator should not control more than approximately 15 or 16 oscillators. And while we have shown the high frequency stability to be ±2 ppm and the low frequency stability to be ±5 ppm, we do not intend the high and low stabilities to be limited to those numerical values. Therefore, while our invention has been described with reference to only one embodiment, it is to be understood that modifications may be made without departing from the spirit of our invention or from the scope of the claims.

What we claim as new and desire to secure by Letters Patent of the United States is:

1. An improved arrangement for providing radio apparatus with a plurality of oscillators, some of which have a high frequency stability and some of which have a low frequency stability, said improved arrangement comprising:

a. a plurality of substantially similar oscillator modules each having an oscillator circuit substantially similar to the other oscillator circuits, a compensator input for said oscillator circuit, and a compensator receptacle;

b. a first compensator positioned in a first of said modules;

c. means connecting the output of said first compensator to only the compensator input of the oscillator in said first module for providing said oscillator of said first module with said high frequency stability;

d. a second compensator positioned in a second of said modules;

e. and means connecting the output of said second compensator in parallel with the compensator input of the oscillator in said second module and to the compensator input of the oscillator in at least a third module for providing said oscillators of said second and third modules with said low frequency stability.

2. The improved arrangement of claim 1, and further comprising means connecting the output of said second compensator in parallel with the compensator inputs of a plurality of other oscillators in others of said modules for providing said other oscillators of said other modules with said low frequency stability.

3. The improved arrangement of claim 1, and further comprising a fourth compensator positioned in a fourth of said modules, and means connecting the output of said fourth compensator to only the compensator input of the oscillator in said fourth module for providing said fourth oscillator of said fourth module with said high frequency stability.

4. The improved arrangement of claim 3, and further comprising means connecting the output of said second compensator in parallel with the compensator inputs of a plurality of other oscillators in others of said modules for providing said other oscillators of said other modules with said low frequency stability.

5. A improved circuit for radio apparatus utilizing a plurality of substantially similar oscillator modules comprising first group of oscillators having high frequency stability characteristics and a second group of oscillators having low frequency stability characteristics, and wherein a. each of said oscillator modules including an oscillator, a compensator input to said oscillator and a receptacle for receiving a compensator, each said receptacle further including means for providing an output from a compensator inserted in said receptacle to said oscillator.

b. said first group of said plurality of oscillator modules, each including a high frequency stability compensator in the receptacle of said respective modules, and c. said second group of said plurality of oscillator modules including a master oscillator module and a plurality of slave oscillator modules, a low frequency stability compensator in the receptacle of said master module, and means interconnecting the output from said low frequency stability compensator in the receptacle of said master module in parallel with the compensation input of each slave oscillator module of said second group of oscillator modules.

* * * * *